United States Patent [19]

Koyama et al.

[11] Patent Number: 5,633,513
[45] Date of Patent: *May 27, 1997

[54] DIAMOND FILM FIELD EFFECT TRANSISTOR

[75] Inventors: Hisashi Koyama; Kozo Nishimura, both of Kobe, Japan

[73] Assignee: Kabushiki Kaisha Kobe Seiko Sho, Kobe, Japan

[*] Notice: The term of this patent shall not extend beyond the expiration date of Pat. No. 5,298,765.

[21] Appl. No.: 156,638

[22] Filed: Nov. 24, 1993

[30] Foreign Application Priority Data

Nov. 24, 1992 [JP] Japan ................................ 4-313151

[51] Int. Cl.$^6$ .................................................. H01L 31/0312
[52] U.S. Cl. ................................................ 257/77; 257/410
[58] Field of Search ....................... 257/77, 410; 361/311; 437/100

[56] References Cited

U.S. PATENT DOCUMENTS

| | | | |
|---|---|---|---|
| H001287 | 2/1994 | Zeisse et al. | 257/410 |
| 5,072,264 | 12/1991 | Jones | 257/77 |
| 5,298,765 | 3/1994 | Nishimura | 257/77 |
| 5,306,928 | 4/1994 | Kimoto et al. | 257/77 |

*Primary Examiner*—Minh-Loan Tran
*Attorney, Agent, or Firm*—Oblon, Spivak, McClelland, Maier & Neustadt, P.C.

[57] ABSTRACT

Disclosed is a diamond film field effect transistor incorporating a p-type semiconducting diamond layer of a specific thickness and B-doping concentration, which has a sufficiently large modulation of the gate voltage dependent current flowing between the source electrode and the drain electrode and whose transistor characteristics are not deteriorated even if adsorption of moisture occurs. Specifically, the diamond film field effect transistor includes; an active layer formed of a p-type semiconducting diamond wherein the concentration of a p-type impurity in the range between $10^{17}/cm^3$ and $10^{20}/cm^3$ and the film thickness is 0.14 μm or less; and a gate electrode formed on the p-type semiconducting diamond active layer through an insulating layer. Further, conductive diamond layers are respectively formed between the p-type semiconducting diamond active layer and a source electrode, and between the p-type semiconducting diamond active layer and a drain electrode; and the electrically insulating diamond layer is deposited such that it also covers part of the conductive diamond layers.

9 Claims, 2 Drawing Sheets

DIAMOND FILM FIELD EFFECT TRANSISTOR

BACKGROUND OF THE INVENTION

1. Field of the Invention

The present invention relates to a diamond film field effect transistor using diamond films.

2. Description of the Related Art

Diamond has an excellent stability against heat, and has a wide band gap of about 5.4 eV. It is an electrically insulating material, but becomes a p-type semiconducting material by being doped with atoms of boron (B). In recent years, as a technique of forming diamond films by vapor phase synthesis has been established, heat-resisting electronic devices such as diodes and transistors have been manufactured using the semiconducting diamond films thus obtained.

FIG. 4 shows one example of device structures of metal-insulator-semiconductor field effect transistors (hereinafter, referred to as "MISFET") using monocrystalline diamond films (Unexamined Japanese Patent Publication No. HEI 1-158774). In this figure, a monocrystalline diamond film 3 doped with boron (B) (hereinafter, referred to as "p-layer") is formed on a monocrystalline electrically insulating diamond substrate 1 by chemical vapor deposition. Moreover, an electrically insulating diamond film 4 (hereinafter, referred to as "i-layer") is selectively deposited on the p-layer 3. A source electrode 5 and a drain electrode 6, and a gate electrode 7 are respectively formed on the p-layer 3 and the i-layer 4 with a specified pattern. The film thickness of the p-layer 3 is specified to be about 0.5 μm.

The prior art MISFET shown in FIG. 4, however, has the following disadvantage: namely, since the film thickness and the B-doping concentration of the p-layer 3, and the film thickness of the i-layer 4 are not optimized, the modulation of the current flowing between the source electrode and the drain electrode is very small. The modulation of the source-drain current is a key factor for operational FETs. In addition, the prior art MISFET structure is also disadvantageous in that the transistor characteristics are deteriorated when moisture and the like become adsorbed on the surface of the p-layer 3, providing an alternative path for the source-drain current.

SUMMARY OF THE INVENTION

An object of the present invention is to provide a diamond film field effect transistor incorporating a p-type semiconducting diamond layer of a specific thickness and B-doping concentration, which has a sufficiently large modulation of the gate voltage dependent current flowing between the source electrode and the drain electrode and whose transistor characteristics are not deteriorated even if adsorption of moisture occurs.

To achieve the above object, according to the present invention, there is provided a diamond film field effect transistor comprising: an active layer formed of a p-type semiconducting diamond wherein the concentration of a p-type impurity is in the range between $10^{17}/cm^3$ and $10^{20}/cm^3$ and the film thickness is 0.14 μm or less; and a gate electrode formed on the p-type semiconducting diamond active layer via an insulating layer. As the p-type impurity, boron (B) is commonly used.

Preferably, in the above diamond film field effect transistor, the insulating layer formed between the p-type semiconducting diamond active layer and the gate electrode comprises an electrically insulating diamond layer. Conductive diamond layers with a hole concentration of $10^{19}/cm^3$ or more are respectively formed between the p-type semiconducting diamond active layer and a source electrode, and between the p-type semiconducting diamond active layer and a drain electrode; and the electrically insulating diamond layer is deposited such that it also covers part of the conductive diamond layers.

Monocrystalline or polycrystalline diamond films may be used as the active layer of the MISFET.

DETAILED DESCRIPTION OF THE PREFERRED EMBODIMENTS

Prior to the description of the preferred embodiments, the mechanism of the diamond film field effect transistor according to the present invention will be described.

Figure 4:
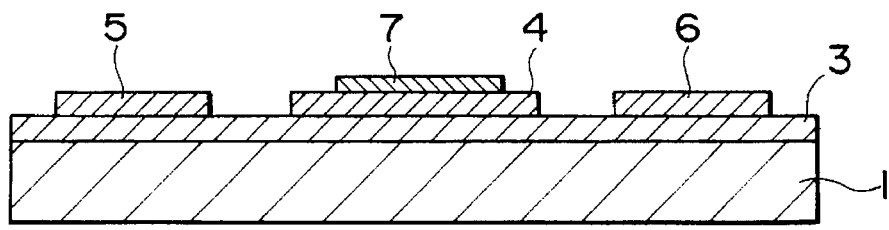
FIG. 4 is a sectional view for explaining a prior art MISFET.

In the present invention, in order to significantly improve the MISFET characteristics, the B-doping concentration of a p-type semiconducting diamond active layer is specified to be in the range between $10^{17}/cm^3$ and $10^{20}/cm^3$. Moreover, the film thickness of the p-type semiconducting diamond active layer is specified to be 0.14 μm or less, preferably, 0.01 μm or more. The reason for this will be described below. In addition, the layer construction of the diamond film field effect transistor according to the present invention is not particularly restricted. The present invention may be applied to any MISFET having a structure in which a p-type semiconducting diamond layer is adopted as the active layer, and a gate electrode is formed on the active layer via an insulating layer. Accordingly, the transistor structure of this general type also includes the prior art structure shown in FIG. 4. In the following description, therefore, the reference symbols of the layer structure shown in FIG. 4 are also indicated for reference.

First, the B-doping concentration of a p-type semiconducting diamond active layer (p-layer 3 in FIG. 4) is taken as Na; the film thickness of an insulating layer (i-layer 4) between the p-type semiconducting diamond active layer and a gate electrode (gate electrode 7) is d; the dielectric constant of diamond is ε; and the unit charge of an electron is q. In this case, when a positive voltage is applied to the gate electrode, the thickness W of a depletion layer generated within the p-type semiconducting diamond layer under the gate electrode is given by the following expression 1:

$$W = \sqrt{\{(2\epsilon/qNa)(V_{bi}+V_G+|V_D|)+d^2\}} - d \quad (1)$$

where $V_G$ is the gate voltage applied, $|V_D|$ is the absolute value of the drain voltage, and $V_{bi}$ is the built-in potential present at the interface between the insulating layer and the p-type semiconducting diamond layer, all of which have a positive value.

In order that the two basic operations of the FET saturation and pinch off are realized and that the modulation of the gate voltage dependent current flowing between the source electrode and the drain electrode is enlarged, the MISFET must satisfy the following conditions:

(1) The thickness W of the depletion layer is able to be increased to a thickness greater than the film thickness of the p-type semiconducting diamond layer 3 by applying the gate voltage $V_G$.

(2) The film thickness of the insulating layer 4 is 0.4 μm or more in order to sufficiently reduce the leak current from the gate electrode (gate electrode 7) to the p-type semiconducting diamond layer (p-layer 3).

(3) The diamond film MISFET is used in the range of $V_G+|V_D| \leq 20$ V. (This is the case for most applications.)

From the above expression 1, the inventors have found that the thickness of the depletion layer W is 0.14 μm or less when the above conditions (2) and (3) are satisfied. In addition, the calculation is made taking the built-in potential $V_{bi}$ as 1 V. This is a suitable value for the diamond layer. Consequently, on the basis of the above condition (1), the film thickness of the p-type semiconducting diamond layer (p-type layer 3) is required to be 0.14 μm or less.

Further, as is apparent from expression 1, when the B-doping concentration of the p-type semiconducting diamond layer (p-layer 3) is less than $10^{17}/cm^3$, the width of the depletion layer W can be increased; however, a problem arises in that the resistance of the p-type semiconducting diamond layer becomes high. Accordingly, the B-doping concentration of the p-type semiconducting diamond layer is required to be $10^{17}/cm^3$ or more.

Conversely, since the width W of the depletion layer is decreased with an increase in the B-doping concentration, the film thickness of the p-type semiconducting diamond layer (p-layer 3) is required to be reduced. In deposition of diamond films, generally, the film thickness cannot be controlled to be 0.01 μm or less, and therefore, the B-doping concentration must be $10^{20}/cm^3$ or less.

In the diamond film field effect transistor of the present invention, conductive, low resistance diamond layers 8 with a hole concentration of $10^{19}/cm^3$ or more are formed between the p-type semiconducting diamond active layer 3 and the source electrode 5, and between the p-type semiconducting diamond active layer and the drain electrode. This makes it possible to reduce the contact resistances between the p-type semiconducting diamond active layer (p-layer 3) and the source electrode, and between the p-type semiconducting diamond active layer (p-layer 3) and the drain electrode 6. The low resistance diamond layers 8 can be formed by the deposition of the diamond films doped with a high concentration of B (p+ layers).

In the p+ diamond layer 8, when the hole concentration is $10^{19}/cm^3$ or more and the electrode material in contact with the p-type semiconducting diamond layer is titanium (Ti), the practical contact resistance value of $10^{-5}$ Ω·$cm^2$ or less can be obtained. Since the electrically insulating diamond layer 4 is deposited such that it also covers part of the conductive diamond layers 8, it is possible to shield the p-type semiconducting diamond active layer 3 from the atmosphere, and hence to prevent the deterioration of the FET characteristics.

Hereinafter, the preferred embodiments of the present invention will be described with reference to the accompanying drawings.

As described above, in the MISFET having the structure shown in FIG. 4, the concentration of atoms of boron in the active p-layer 3 may be in the range between $10^{17}/cm^3$ and $10^{20}/cm^3$, and the film thickness of the p-layer 3 may be 0.14 μm or less.

In the MISFET having the structure shown in FIG. 4, however, the active p-layer 3 is exposed to the atmosphere, so that the transistor characteristics tend to be deteriorated with age by the adsorption of water content in the atmosphere or by a leak current transmitted across the surface of the p-layer 3.

Figure 1:
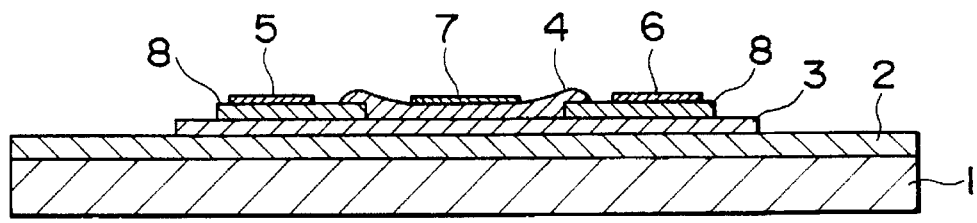
FIG. 1 is a sectional view showing an MISFET according to an embodiment of the present invention.

FIG. 1 shows the MISFET according to the example of the present invention which has solved the above problem. In the MISFET, a base layer 2 is formed on a substrate 1, and a p-type semiconducting diamond layer (p-layer 3) is formed on the base layer 2. The p+ layers 8 are selectively formed on the p-layer 3 in two places. The p+layers 8 are conductive diamond layers with a hole concentration of $10^{19}/cm^3$ or more. A source electrode 5 and a drain electrode 6 are formed on the p+ layers 8. Further, an insulating i-layer 4 is formed on the p-layer 3 between the p+ layers 8 in such a manner as to slightly cover both the p+ layers 8. The i-layer 4 is an electrically insulating diamond layer, and has a thickness of 0.4 μm or more.

Thus the p-layer 3 can be shielded from the atmosphere by adoption of the structure in which the i-layer 4 is deposited such that it also covers part of the p+ layers 8. This makes it possible to prevent the deterioration with age in the FET characteristics.

The MISFETs according to the embodiment of the present invention were actually manufactured, and the characteristics thereof were compared with comparative examples. The results will be described below.

EXAMPLE 1

The MISFET having the structure shown in FIG. 1 was manufactured as follows: First, a silicon nitride substrate (substrate 1) was polished for about 1 hr, using a diamond paste with a particle size of 1 μm, and then cleaned. A base layer 2 of an electrically insulating diamond film was deposited on the substrate 1 to a thickness of 5 μm using a thermal filament CVD method or a microwave CVD method. Then, a p-layer 3 was selectively deposited according to an FET device pattern by the microwave CVD method using a source gas composed of a gas mixture of methane (0.5%), hydrogen (99.5%) and $B_2H_6$ (0.5 ppm). The film thickness of the p-layer 3 was 0.09 μm, and the B-doping concentration was $10^{17}/cm^3$.

Subsequently, the p+ layers 8 with a thickness of 0.1 μm were selectively deposited using the same deposition method as described above except that the $B_2H_6$ concentration in the source gas was 5 ppm. The hole concentration in the p+ layers 8 was $10^{20}/cm^3$. Then, as shown in FIG. 1, an i-layer 4 was formed such that it completely covered the exposed p-layer 3 between the two p+ layers and further overlapped the edges of both the p+ layers 8. The film thickness of the i-layer 4 was 0.4 μm.

After that, a resist film was formed by photolithography on the basis of a prescribed pattern, and a film with a two-layer structure of Ti layer/Au layer was formed by sputtering, to provide a source electrode 5 and a drain electrode 6 according to the prescribed pattern. Finally, a gate electrode 7 of Al was formed by vacuum deposition using the same photolithography method as described above.

Figure 2:
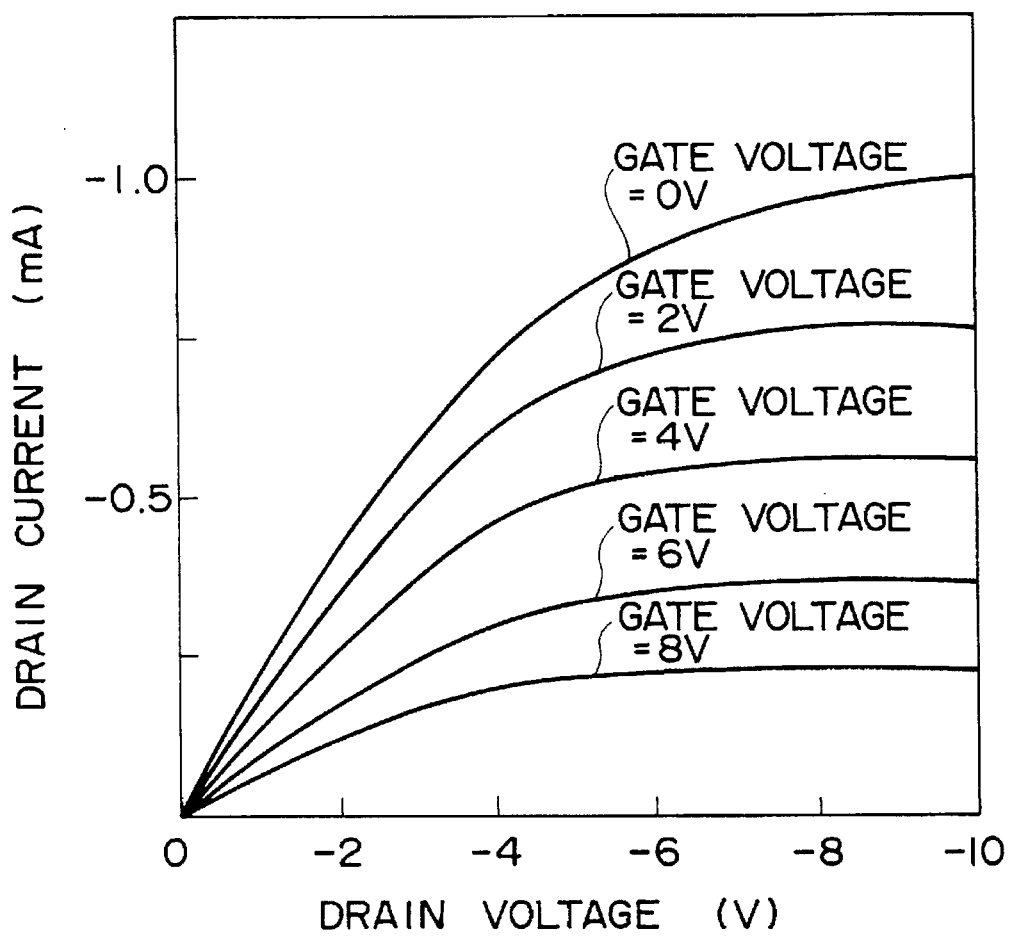
FIG. 2 is a graph showing the relationship between the drain voltage and the drain current according to the embodiment of the present invention.

FIG. 2 shows the current-voltage characteristic (hereinafter, referred to as "I-V characteristic") between the source electrode and the drain electrode for the MISFET thus manufactured, for gate voltages in the range 0–8 V when the drain voltage is applied from 0 to −10 V. In this figure, the abscissa indicates the drain voltage, and the ordinate indicates the drain current. The I-V characteristic in FIG. 2 shows a typical FET characteristic. For the I-V characteristic when the source-drain voltage is −5 V or less, the saturation characteristic of an FET was observed.

Figure 3:
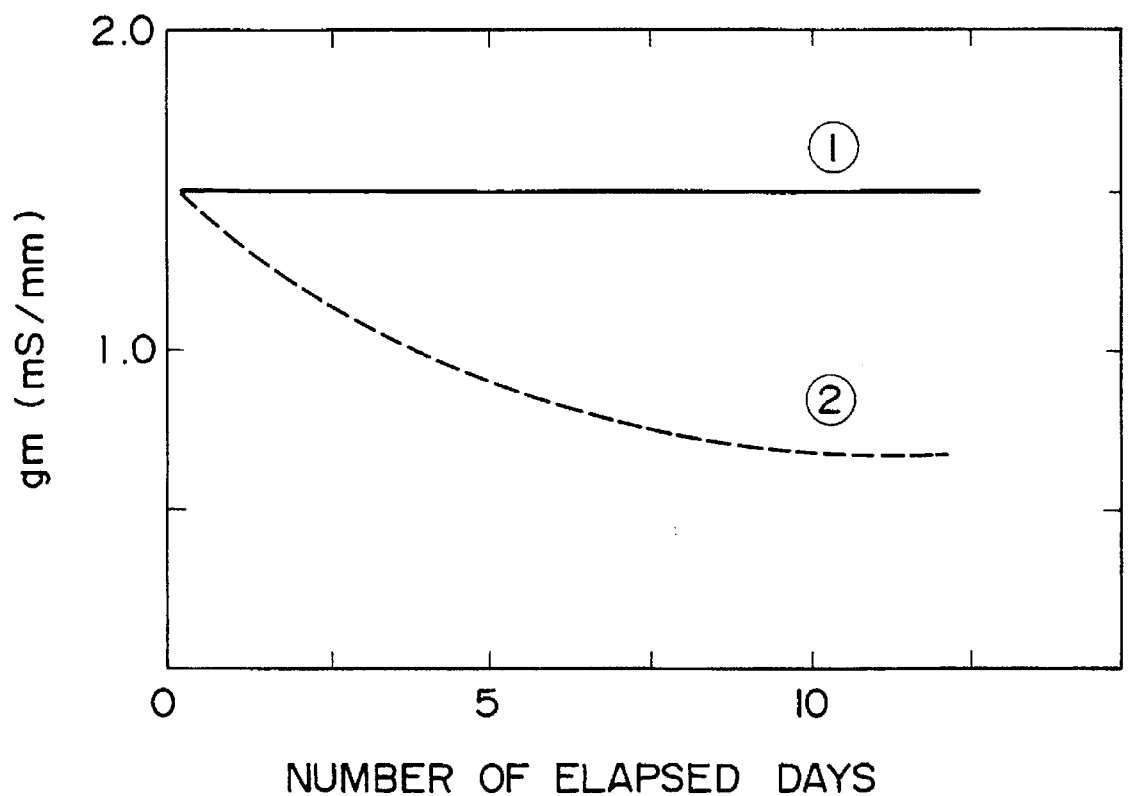
FIG. 3 is a graph showing the deterioration with age in transistor characteristics according to the embodiment of the present invention.

FIG. 3 shows the deterioration with age in the transconductance (hereinafter, referred to as "$g_m$") for the MISFET thus manufactured. In this figure, as shown by the solid line ①, the deterioration with age was hardly seen for the PET in which the p-layer 3 was covered with the i-layer 4. On the contrary, for the FET manufactured in the same manner as in this example but which has the structure shown in FIG. 4, as shown by the dotted line ②, $g_m$ was reduced to a value half or less of the starting value after an elapsed time of 1800 hrs.

EXAMPLE 2

The MISFET having the structure shown in FIG. 1 was manufactured using a monocrystalline (100) substrate of a type 2a under the same conditions as in Example 1 except that the methane concentration was 3% for the chemical vapor deposition of the p-layer 3 and the i-layer 4. The film thickness of the i-layer 4 was 0.4 μm. The MISFET thus manufactured indicates the same I-V characteristic as shown in FIG. 2; however, since the mobility of the p-layer is made larger by about a factor of 10, the current flowing between the source electrode and the drain electrode was about 10 times as much as that in the case of FIG. 2. Further, as for the deterioration with age in the transconductance, the deterioration of the characteristics was not observed after an elapse of 1000 hrs.

As described above, according to the present invention, the B-doping concentration of the p-type semiconducting diamond active layer is specified to be in the range between $10^{17}/cm^3$ and $10^{20}/cm^3$, and the film thickness thereof is specified to be 0.14 μm or less, and accordingly, it is possible to obtain an MISFET excellent in transistor characteristics and which displays a reduced deterioration with age.

We claim:

1. A diamond film field effect transistor comprising:

an active layer formed of p-type semiconducting diamond having a p-type impurity concentration in a range between $10^{17}/cm^3$ and $10^{20}/cm^3$ and having a film thickness of 0.14 μm or less;

an insulating layer formed on said active layer; and a gate electrode formed on said insulating layer.

2. The diamond film field effect transistor of claim 1 wherein said insulating layer comprises an electrically insulating diamond layer.

3. The diamond film field effect transistor of claim 1 which further comprises;

conductive diamond layers formed on said active layer wherein said conductive layers have a hole concentration of $10^{19}/cm^3$ or more;

source and drain electrodes formed on said conductive diamond layers; and wherein said insulating layer also covers a part of said conductive diamond layers.

4. The diamond film field effect transistor of claim 3 wherein said insulating layer comprises an electrically insulating diamond layer.

5. The diamond film field effect transistor of claim 2 or 4 wherein said electrically insulating diamond layer has a thickness of 0.4 μm or more.

6. A diamond film field effect transistor comprising:

a base layer made of an electrically insulating diamond film;

an active layer disposed on the base layer and formed of a p-type semiconducting diamond material having a p-type impurity concentration in a range between $10^{17}/cm^3$ and $10^{20}/cm^3$ and having a film thickness of 0.14 μm or less;

first and second conductive diamond layers disposed on said active layer and having a hole concentration of $10^{19}/cm^3$ or more, said first and second conductive diamond layers separated on said active layer;

an insulating layer disposed on said active layer everywhere between said first and said second conductive diamond layers and formed on a portion of said first and said second conductive diamond layers;

a drain electrode disposed on said first conductive diamond layer;

a gate electrode disposed on said insulating layer; and a source electrode disposed on said second conductive diamond layer.

7. The diamond film field effect transistor of claim 6, wherein said insulating layer is an electrically insulating diamond layer.

8. The diamond film field effect transistor of claim 6, wherein said p-type impurity concentration is Boron.

9. The diamond film field effect transistor of claim 6, wherein said thickness of the depletion layer (W) satisfies the following equation:

$$W = \sqrt{\{(2\epsilon/qNa)(V_{bi} + V_G + |V_D|) + d^2\}} - d$$

wherein $\epsilon$ is a dielectric constant of diamond, q is the unit charge of an electron, d is a thickness of the insulating layer, Na is said p-type impurity concentration of said active layer, $V_{bi}$ is a built-in potential present at an interface between said insulating layer and said active layer, $V_G$ is said gate voltage and $|V_D|$ is an absolute value of a drain voltage, a sum of said gate voltage and said absolute value of said drain voltage $V_G+|V_D|$ is not greater than 20 V, wherein $V_{bi}$ is about one volt.

\* \* \* \* \*